(12) United States Patent
Jacob et al.

(10) Patent No.: US 11,374,143 B2
(45) Date of Patent: Jun. 28, 2022

(54) FIN-BASED PHOTODETECTOR STRUCTURE

(71) Applicant: GLOBALFOUNDRIES U.S. Inc., Santa Clara, CA (US)

(72) Inventors: Ajey Poovannummoottil Jacob, Watervliet, NY (US); Yusheng Bian, Ballston, NY (US); Steven Shank, Jericho, VT (US)

(73) Assignee: GLOBALFOUNDRIES U.S. INC., Santa Clara, CA (US)

( * ) Notice: Subject to any disclaimer, the term of this patent is extended or adjusted under 35 U.S.C. 154(b) by 348 days.

(21) Appl. No.: 16/740,664

(22) Filed: Jan. 13, 2020

(65) Prior Publication Data

US 2021/0217916 A1 Jul. 15, 2021

(51) Int. Cl.
| | | |
|---|---|---|
| *H01L 31/103* | (2006.01) | |
| *G02B 6/13* | (2006.01) | |
| *H01L 31/0392* | (2006.01) | |
| *G02B 6/12* | (2006.01) | |

(52) U.S. Cl.
CPC ........ *H01L 31/103* (2013.01); *G02B 6/12004* (2013.01); *G02B 6/131* (2013.01); *H01L 31/03921* (2013.01); *G02B 2006/12061* (2013.01)

(58) Field of Classification Search
None
See application file for complete search history.

(56) References Cited

U.S. PATENT DOCUMENTS

| | | | |
|---|---|---|---|
| 9,318,622 B1 | 4/2016 | Logan et al. | |
| 9,864,136 B1 | 1/2018 | Jacob | |
| 10,324,258 B2* | 6/2019 | Li | H01S 5/0268 |
| 10,475,956 B2* | 11/2019 | Atanackovic | H01L 33/325 |
| 11,177,404 B2* | 11/2021 | Jacob | H01L 31/1808 |
| 11,227,960 B2* | 1/2022 | Bian | H01L 27/1446 |
| 11,243,350 B2* | 2/2022 | Bian | G02B 6/124 |
| 2018/0301569 A1 | 10/2018 | Jacob | |
| 2020/0105957 A1* | 4/2020 | Mathai | G02B 6/12 |

OTHER PUBLICATIONS

US 11,271,135 B2, 03/2022, Atanackovic (withdrawn)*
Assefa et al., "CMOS-integrated high-speed MSM germanium waveguide photodetector," Optics Express, 18:4986-99, Mar. 1, 2010.

(Continued)

*Primary Examiner* — Steven M Christopher
(74) *Attorney, Agent, or Firm* — Francois Pagette; Hoffman Warnick LLC

(57) ABSTRACT

One illustrative photodetector disclosed herein includes an N-doped waveguide structure defined in a semiconductor material, the N-doped waveguide structure comprising a plurality of first fins, and a detector structure positioned on the N-doped waveguide structure, wherein a portion of the detector structure is positioned laterally between the plurality of first fins. In this example, the photodetector also includes at least one N-doped contact region positioned in the semiconductor material and a P-doped contact region positioned in the detector structure.

13 Claims, 15 Drawing Sheets

(56) References Cited

OTHER PUBLICATIONS

Balram et al., "Nanoscale resonant-cavity-enhanced germanium photodetectors with lithographically defined spectral response for improved performance at telecommunications wavelengths," Optics Express, 21:10228-33, Apr. 22, 2013.
Joseph S. Braley, Photo Detectors.
Wang et al., "High-performance GeSn photodetector and fin field-effect transistor (FinFET) on an advanced GeSn-on-insulator platform," Optics Express, 26:10305-14, Apr. 16, 2018.
Zhang et al., "Simulation investigation of tensile strained GeSn fin photodetector with Si3N4 liner stressor for extension of absorption wavelength," Optics Express, 23:739-46, Jan. 26, 2015.

* cited by examiner

FIN-BASED PHOTODETECTOR STRUCTURE

BACKGROUND

Field of the Invention

The present disclosure generally relates to various novel embodiments of a fin-based photodetector structure and various methods of making such a structure.

Description of the Related Art

A need for greater bandwidth in fiber optic network links is widely recognized. The volume of data transmissions has seen a dramatic increase in the last decade. This trend is expected to grow exponentially in the near future. As a result, there exists a need for deploying an infrastructure capable of handling this increased volume and for improvements in system performance. Fiber optics communications have gained prominence in telecommunications, instrumentation, cable TV, network, and data transmission and distribution. A fiber optics communication system or link includes a photodetector element. The function of the photodetector element in a fiber optics communication system is to convert optical power into electrical voltage or current. The most common photodetector used in fiber optics applications is the semiconductor photodetector. There are many other applications where a photodetector may be employed, e.g., radiation detection, smoke detection, flame detection and to switch on relays for street lighting, etc. When incident light from, for example, a laser or an optical fiber irradiates the photodetector, light photons in the incident light are absorbed by the photodetector. The absorption of the light photons results in the creation of electron-hole pairs in the depletion region of the photodetector.

There is a need to produce a novel photodetector that is efficient to manufacture and may produce benefits with respect to the optical system or link in which such photodetectors are employed. The present disclosure is generally directed to various novel embodiments of a fin-based photodetector structure and various methods of making such a structure.

SUMMARY

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

The present disclosure is directed to various novel embodiments of a fin-based photodetector structure and various methods of making such a structure. One illustrative photodetector disclosed herein includes an N-doped waveguide structure defined in a semiconductor material, the N-doped waveguide structure comprising a plurality of first fins, and a detector structure positioned on the N-doped waveguide structure, wherein a portion of the detector structure is positioned laterally between the plurality of first fins. In this example, the photodetector also includes at least one N-doped contact region positioned in the semiconductor material and a P-doped contact region positioned in the detector structure.

One illustrative method disclosed herein includes forming a plurality of first fins in an N-doped active semiconductor layer of a semiconductor-on-insulator (SOI) substrate so as to define an N-doped waveguide structure, performing at least one epitaxial growth process to form a detector structure on the N-doped waveguide structure, wherein a portion of the detector structure is positioned laterally between the plurality of first fins, and forming at least one N-doped contact region in the N-doped active semiconductor layer. In this example, the method also includes forming a P-doped contact region in the detector structure.

BRIEF DESCRIPTION OF THE DRAWINGS

The disclosure may be understood by reference to the following description taken in conjunction with the accompanying drawings, in which like reference numerals identify like elements, and in which.

Figure 1:
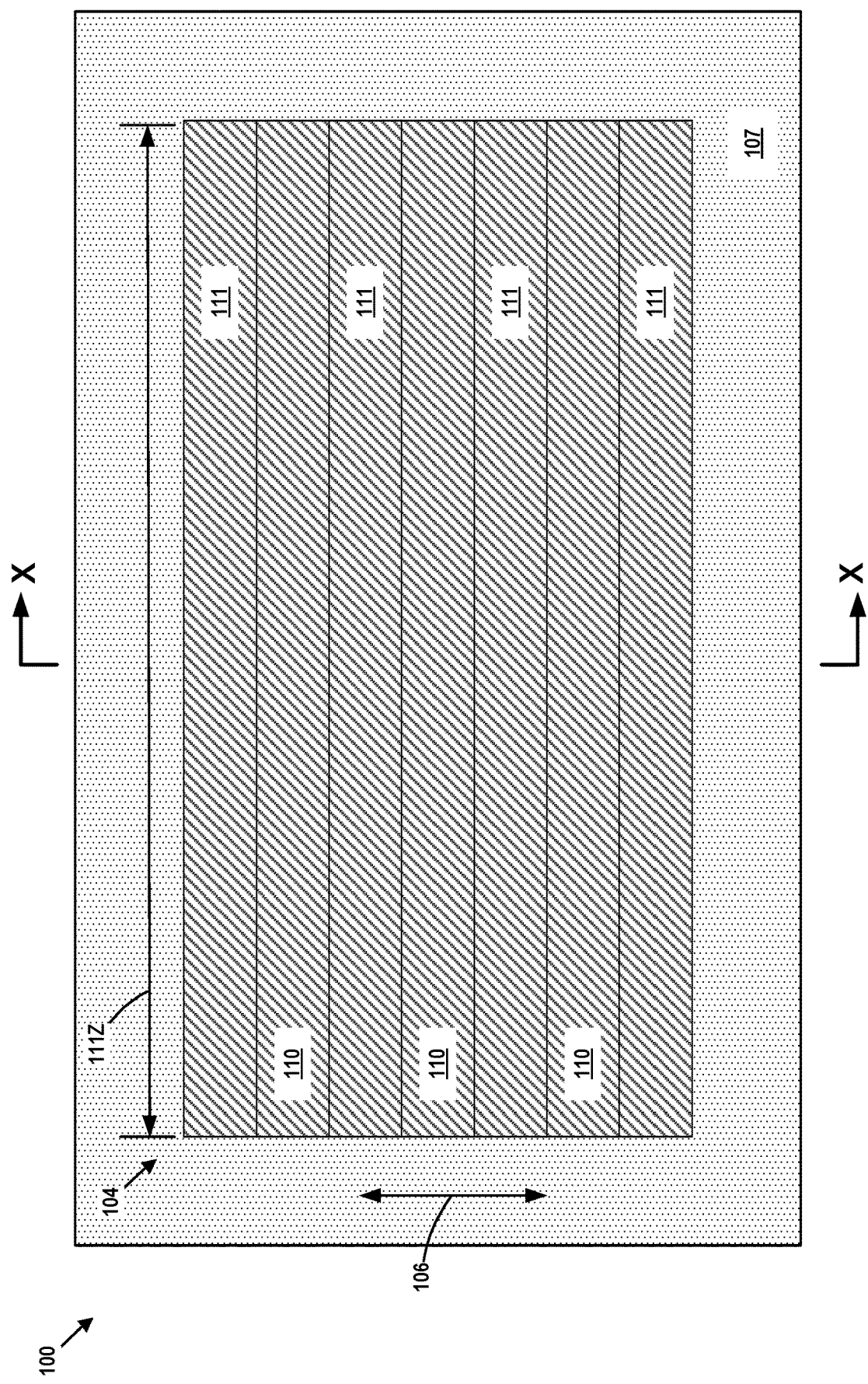
FIGS. 1-15 depict various novel embodiments of a fin-based photodetector structure and various methods of making such a structure. The drawings are not to scale.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase. As will be readily apparent to those skilled in the art upon a complete reading of the present application, the presently disclosed method may be applicable to a variety of products, including, but not limited to, logic products, memory products, etc. With reference to the attached figures, various illustrative embodiments of the methods and devices disclosed herein will now be described in more detail. The various components, structures and layers of material depicted herein may be formed using a variety of different materials and by performing a variety of known process operations, e.g., chemical vapor deposition (CVD), atomic layer deposition (ALD), a thermal growth process, spin-coating techniques, masking, etching, etc. The thicknesses of these various layers of material may also vary depending upon the particular application.

FIGS. 1-15 depict various novel embodiments of a fin-based photodetector structure 100 and various methods of making such a structure. FIG. 1 is a simplistic plan view of the photodetector 100 at an intermediate stage of fabrication. As depicted therein, the photodetector 100 comprises a plurality of fins 111 that were formed in a semiconductor substrate by etching a plurality of fin-formation trenches 110 in the substrate. Also depicted in FIG. 1 is an isolation structure 107 that is formed to electrically isolate the photodetector 100. The location where various cross-sectional views (view X-X) depicted herein is also shown in FIG. 1.

Figure 2:
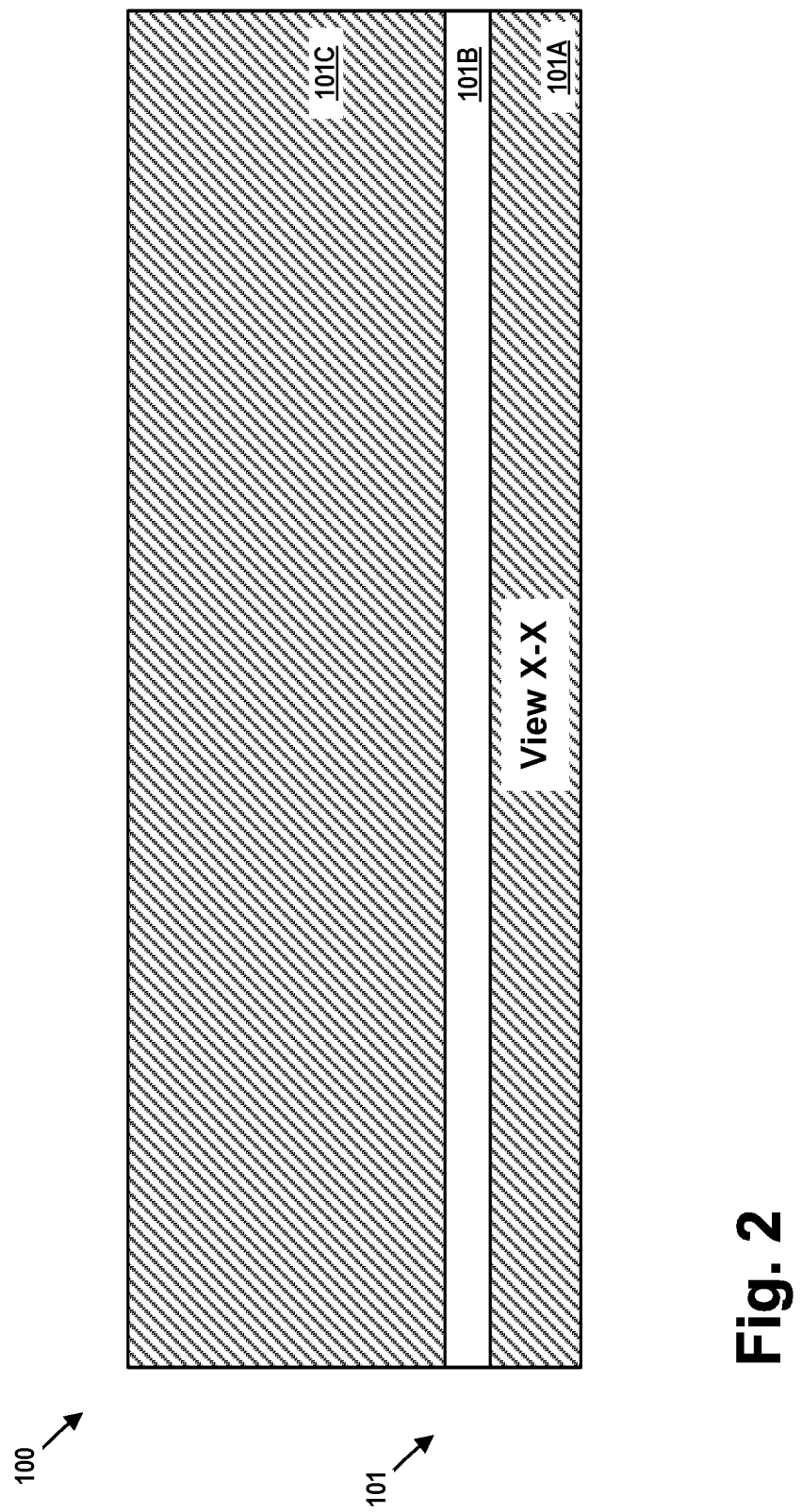

With reference to FIG. 2, in the examples depicted herein, the photodetector structure 100 will be formed above a semiconductor substrate 101. The substrate 101 may have a variety of configurations, such as a semiconductor-on-insulator (SOI) shown in FIG. 2. Such an SOI substrate 101 includes a base semiconductor layer 101A, a buried insulation layer 101B positioned on the base semiconductor layer 101A and an active semiconductor layer 101C positioned above the buried insulation layer 101B, wherein the photodetector structure 100 will be formed in and above the active semiconductor layer 101C. In one illustrative embodiment, the active semiconductor layer 101C may be an N+ doped region material having a dopant concentration that falls within the range of about 1E18-1E20 ions/cm$^3$. The location of the peak concentration of dopant atoms in the N+ doped active semiconductor layer 101C may also vary depending upon the particular application. The N+ doped active semiconductor layer 101C may be doped with any species of N-type dopant, e.g., arsenic, phosphorus, etc. In other applications, the substrate 101 may be made of silicon or it may be made of semiconductor materials other than silicon. Thus, the terms "substrate" or "semiconductor substrate" should be understood to cover all semiconductor materials and all forms of such materials.

Figure 3:
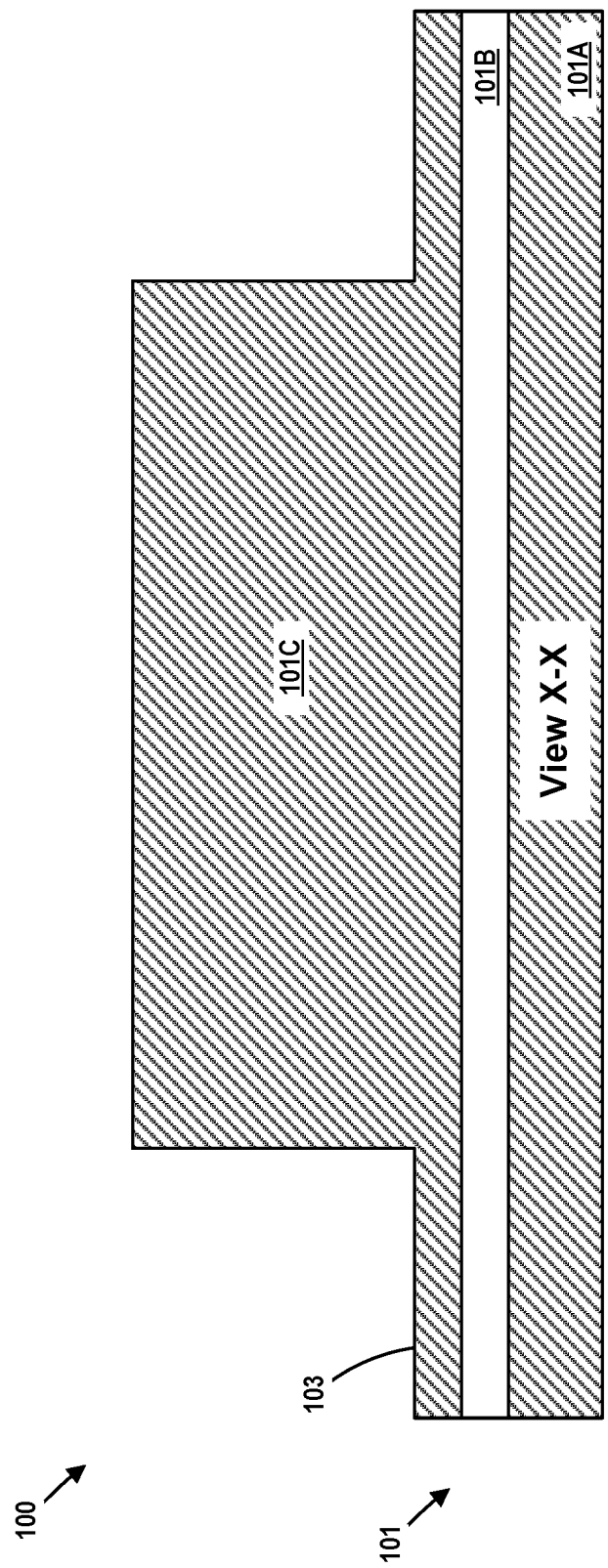

FIG. 3 depicts the photodetector 100 after a trench 103 was formed in the active semiconductor layer 101C by performing known masking and etching techniques. The depth of the trench 103 may vary depending upon the particular application. As depicted, in this illustrative embodiment, the trench 103 does not extend through the entire vertical thickness of the active semiconductor layer 101C.

Figure 4:
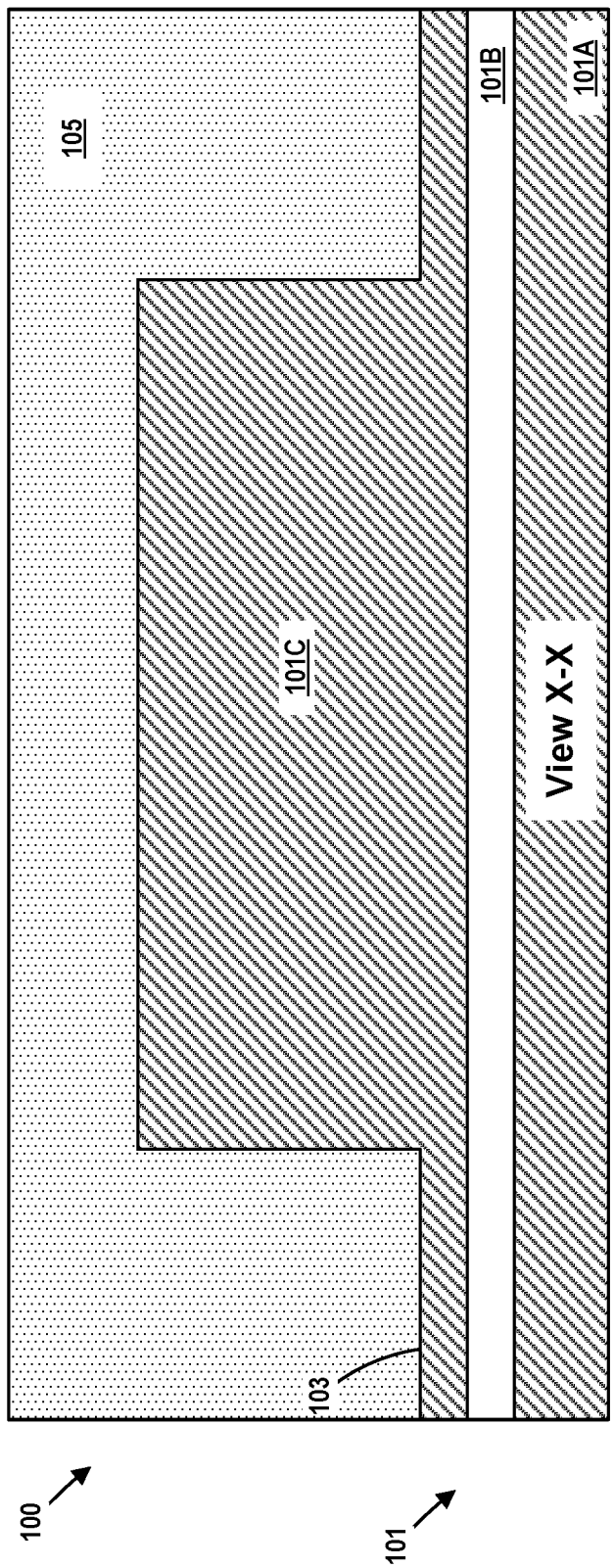

FIG. 4 depicts the photodetector 100 after a layer of insulating material 105 was blanket-deposited across the substrate 101. The layer of insulating material 105 may be comprised of a variety of different materials, e.g., silicon dioxide.

Figure 5:
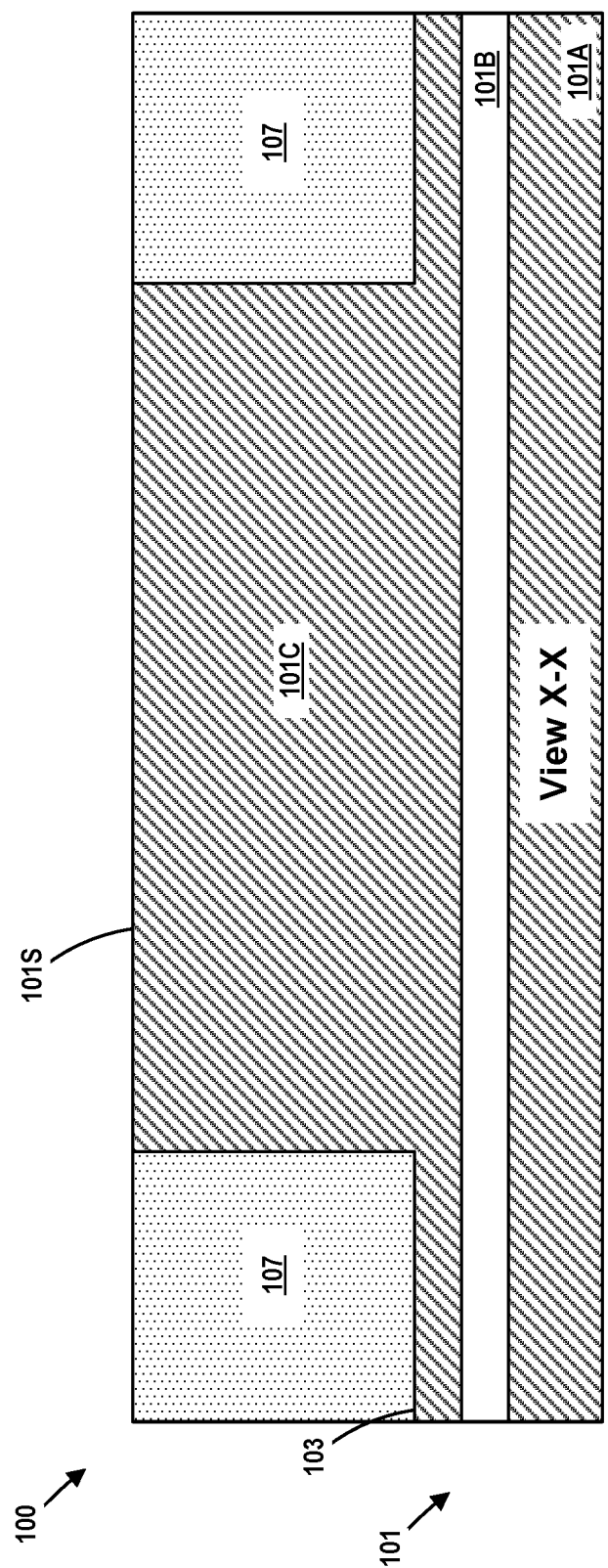

FIG. 5 depicts the photodetector 100 after a planarization process, e.g., a chemical mechanical planarization (CMP) process was performed to remove portions of the layer of insulating material 105 positioned above the upper surface 101S of the active semiconductor layer 101C. This process operation results in the formation of the isolation structure 107.

Figure 6:
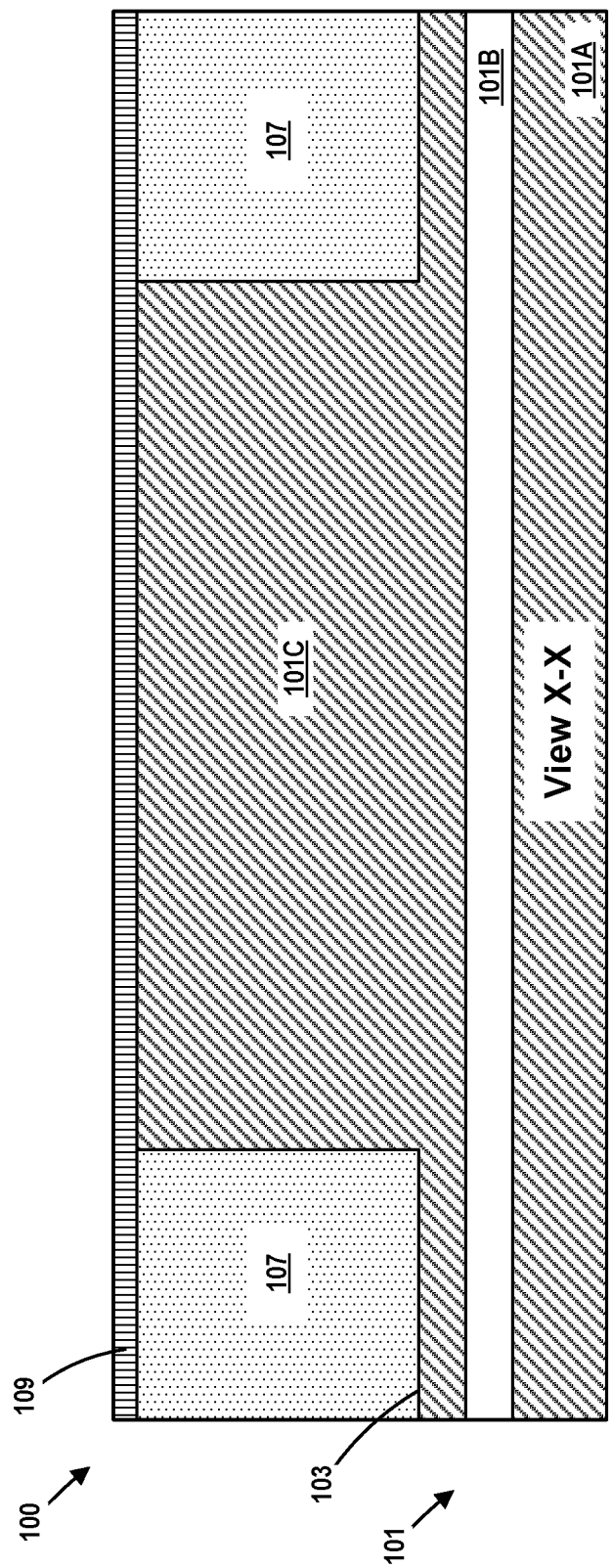

FIG. 6 depicts the photodetector 100 after a layer of insulating material 109 was blanket-deposited across the substrate 101. The layer of insulating material 109 may be comprised of a variety of different materials, e.g., silicon nitride, and it may be formed to any desired thickness, e.g., 5-50 nm.

Figure 7:
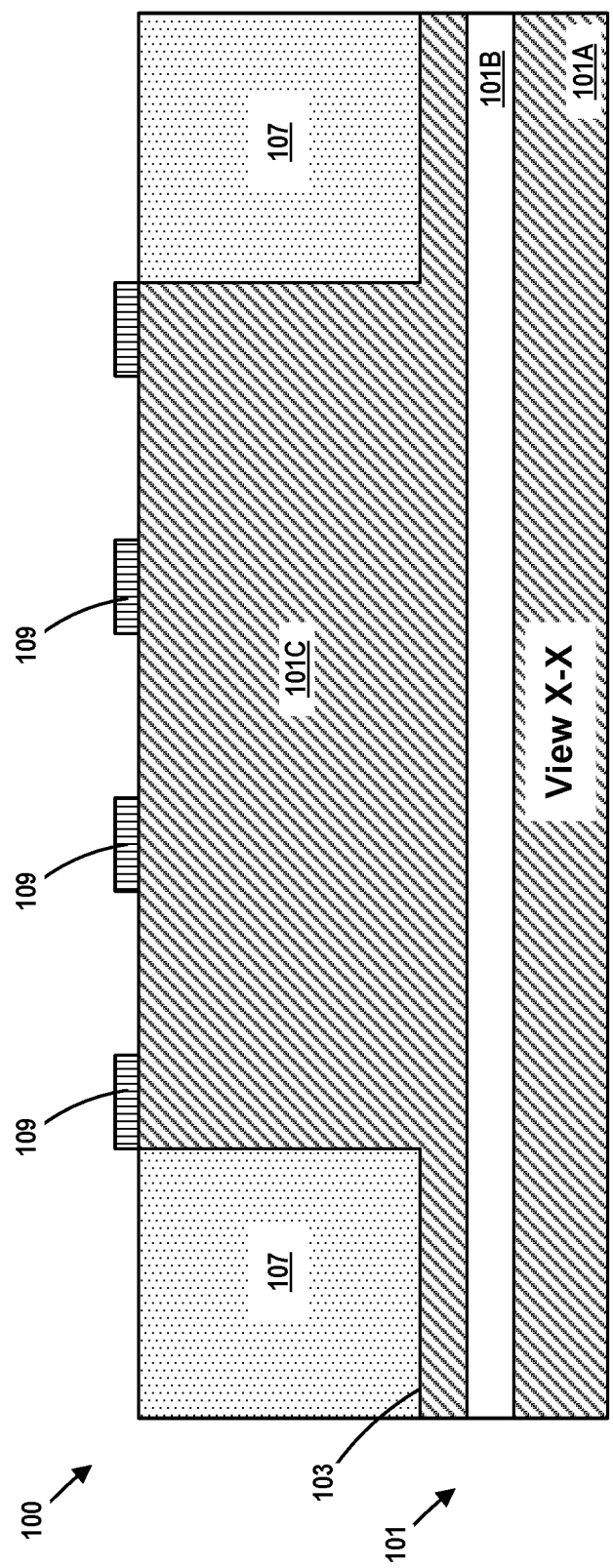

FIG. 7 depicts the photodetector 100 after a patterned etch mask (not shown) was formed above the layer of insulating material 109 and after an etching process was performed to pattern the layer of insulating material 109. Thereafter, the patterned etch mask was removed.

Figure 8:
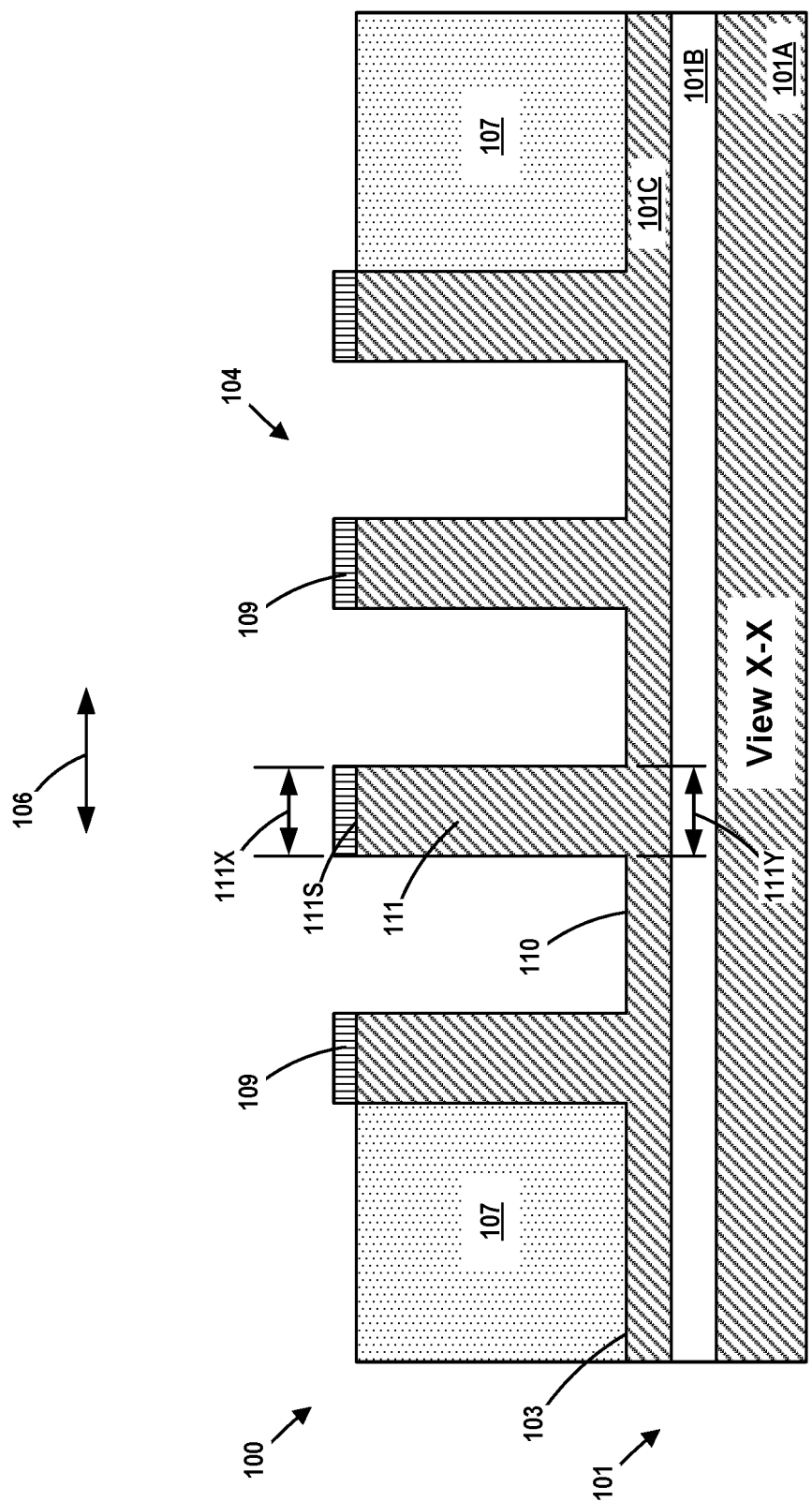

FIG. 8 depicts the photodetector 100 after one or more etching processes were performed so as to define a plurality of fin-formation trenches 110 in the active semiconductor layer 101C. This etching process results in the formation of a plurality of fins 111 defined in the active semiconductor layer 101C. In the illustrative example where the active semiconductor layer 101C comprises silicon, these operations result in the formation of a silicon waveguide structure 104 that comprises the four illustrative upward extending fins 111. Of course, the photodetector 100 may comprise any number of fins 111 and the waveguide structure may be comprised of a variety of different material, e.g., a silicon-containing material, substantially pure silicon, silicon germanium, etc. The depth and width of the trenches 110 may vary depending upon the particular application.

With continued reference to FIG. 8, the height and cross-sectional configuration of the fins 111 may also vary depending upon the particular application. In the examples depicted herein, the fins 111 will be depicted as have a simplistic rectangular cross-sectional configuration having a substantially uniform thickness throughout the height of the fins 111. In a real-world device, the fins 111 may have a tapered cross-sectional configuration wherein the width 111X of the upper surface 111S of the fin 111 (i.e., the fin top critical dimension) in the direction 106 is less than the width 111Y of the bottom of the fin 111 (i.e., the fin bottom critical dimension). In one illustrative embodiment, based upon current-day technology, the width 111X may be about 5-30 nm. Additionally, with reference to FIG. 1, the axial length 111Z of the fins 111 may also vary depending upon the particular application, e.g., 0.1-20 μm. Thus, the size and configuration of the fin-formation trenches 110 and the fins 111, and the manner in which they are made, should not be considered a limitation of the presently disclosed subject matter. Moreover, in the example depicted herein, the layer of insulating material 109 was patterned and used as a patterned etch mask to form the trenches 110 and the fins 111. In other process flows, a patterned etch mask (not shown) may be formed above the un-patterned layer of insulating material 109. Thereafter, one or more etching processes may be performed through the patterned etch mask to etch both the layer of insulating material 109 and to form the trenches 110.

Figure 9:
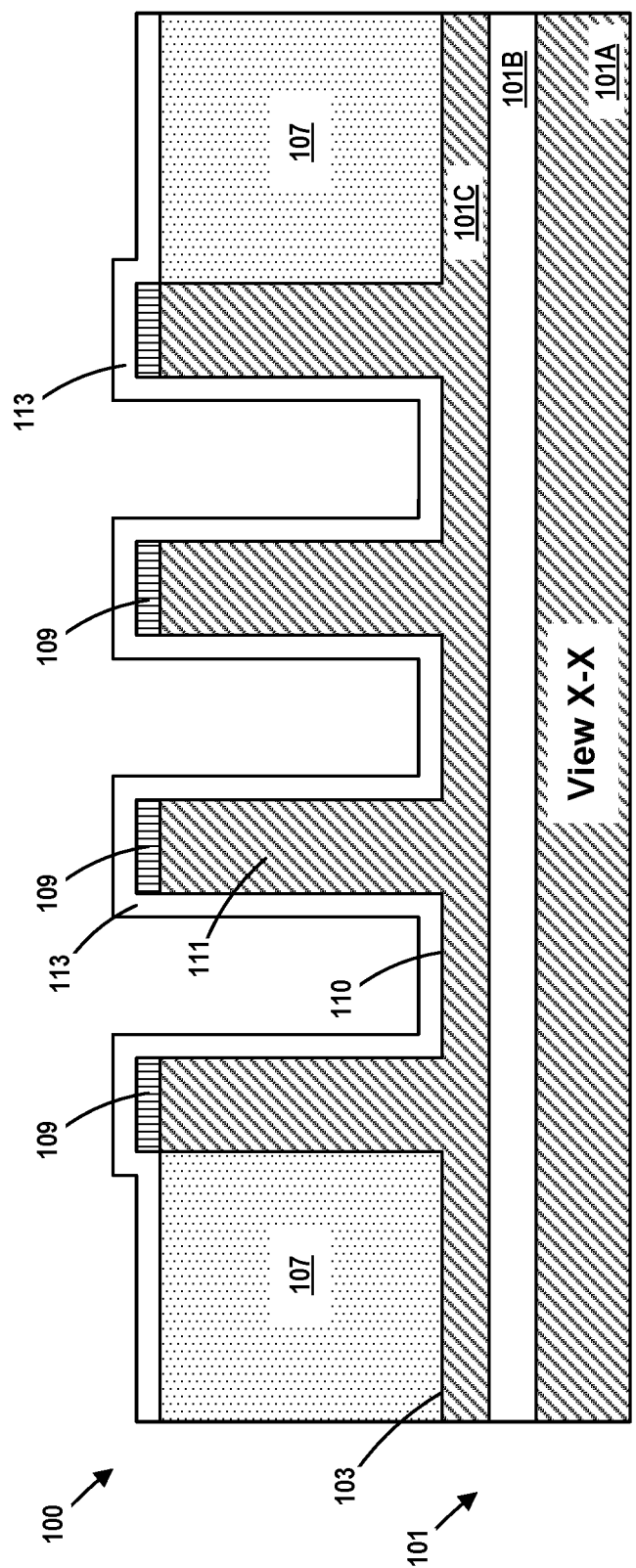

FIG. 9 depicts the photodetector 100 after a conformal deposition process was performed to form a conformal layer of spacer material 113 above the substrate 101. The conformal layer of spacer material 113 may be comprised of a variety of different materials, e.g., silicon dioxide, and it may be formed to any desired thickness, e.g., 1-6 nm.

Figure 10:
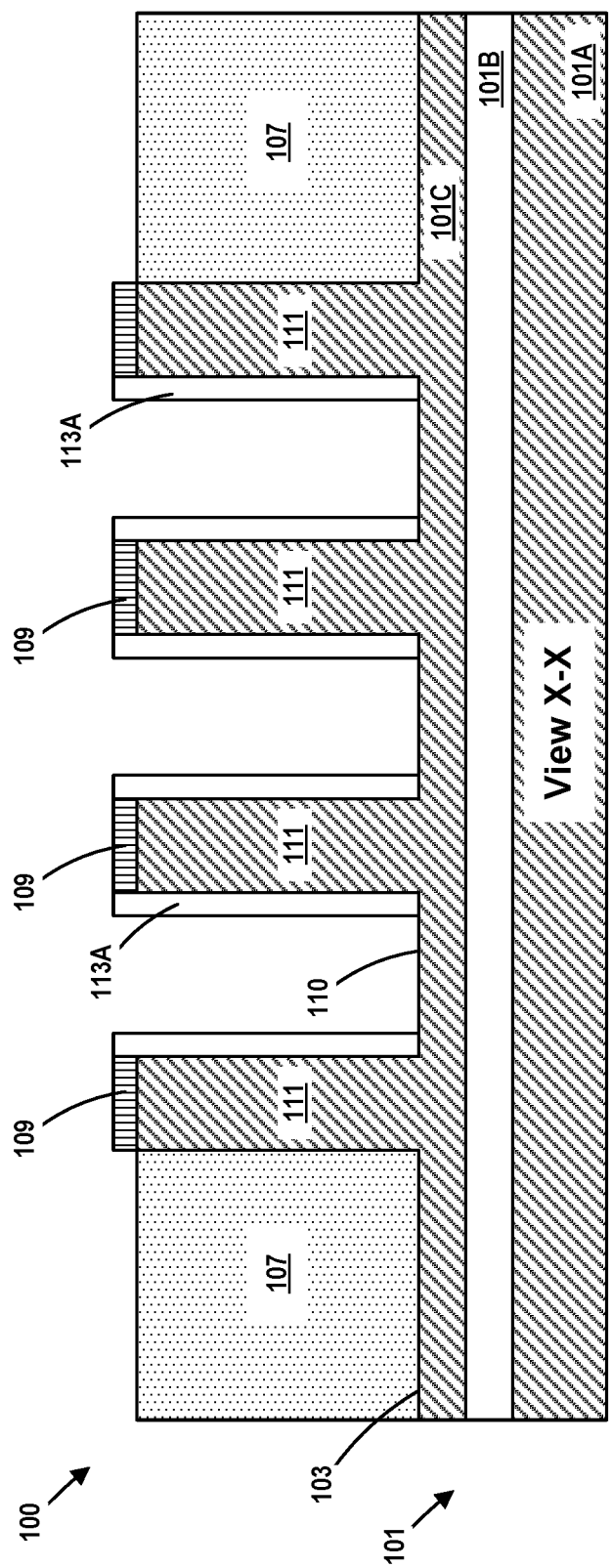

FIG. 10 depicts the photodetector 100 after an anisotropic etching process was performed to remove substantially horizontally oriented portions of the conformal layer of spacer material 113. This process operation results in the formation of a sidewall spacer 113A on the sidewalls of the fins 111. Note that the bottom of the trenches 110 is exposed after the formation of the sidewall spacers 113A.

Figure 11:
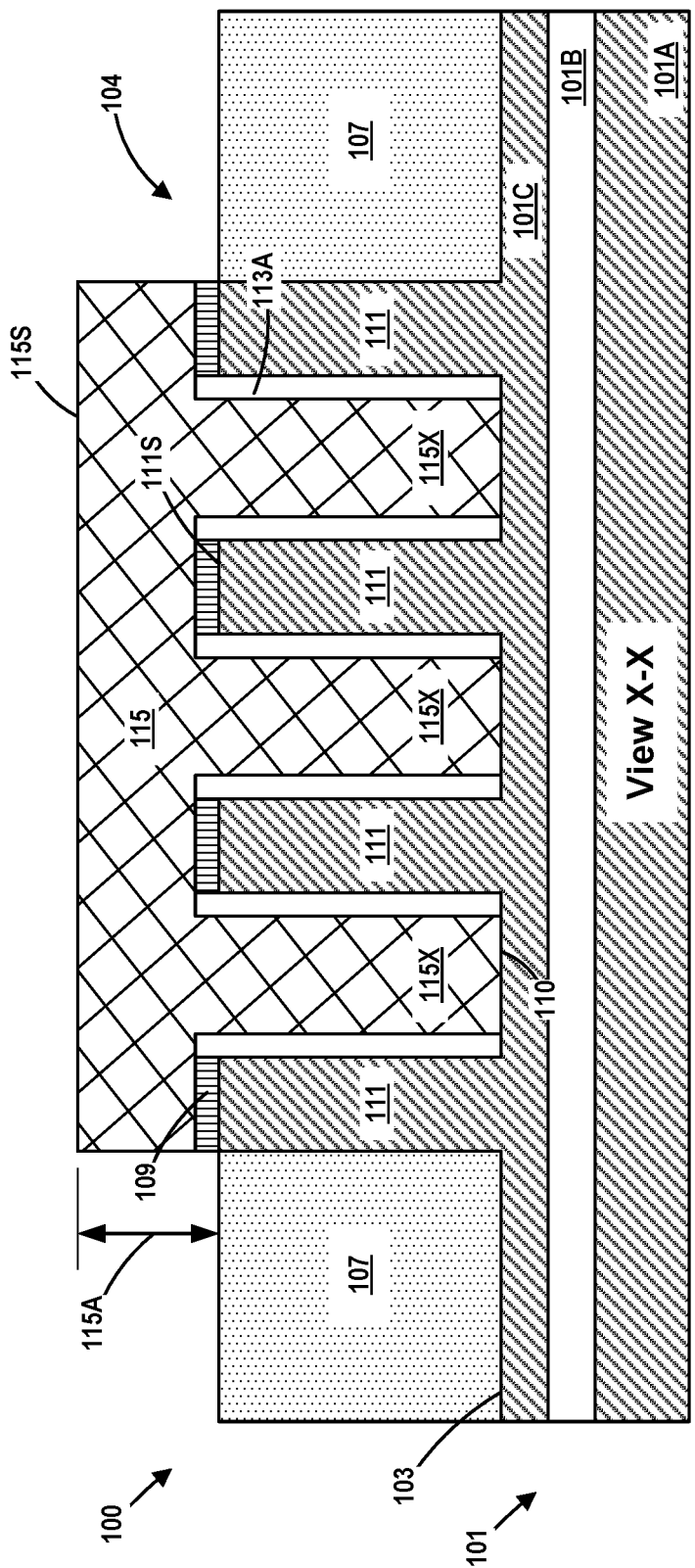
Figure 12:
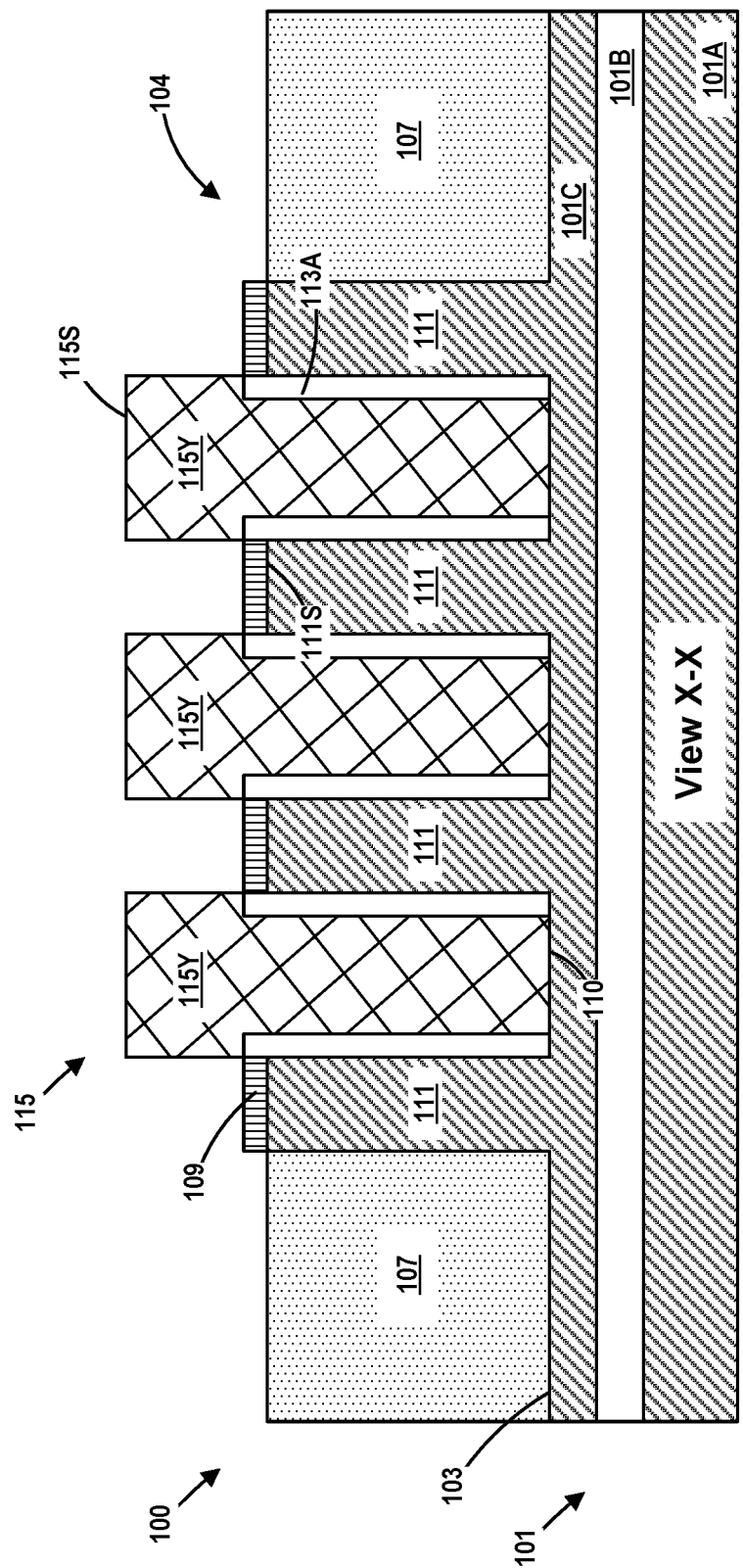

FIG. 11 depicts the photodetector structure 100 after an epitaxial semiconductor material 115, having an upper surface 115S, was formed on the waveguide structure 104 by performing traditional epitaxial semiconductor growth processes. As will be appreciated by those skilled in the art after a complete reading of the present application, the region of epitaxial semiconductor material 115 will function as the detector region or portion of the photodetector structure 100, and henceforth will be referred to as the detector structure 115. Note that, since the sidewall of the fins 111 are covered by the spacers 113A, the detector structure 115 grows upward within the trenches 110 using the bottom of the trenches 110 as a growth surface, which should reduce the number of defects, if any, in the detector structure 115. The detector structure 115 may be comprised of a variety of different materials, e.g., a germanium-containing material, substantially pure germanium, silicon-germanium, etc.

In one illustrative embodiment, the detector structure 115 may be substantially free of dopant material, e.g., an intrinsic semiconductor material, or it may be doped with a P-type dopant and become a P+ doped detector structure 115. In one illustrative process flow, the detector structure 115 may be a P+ doped detector structure 115 that is doped with a P-type dopant as it is grown, i.e., it may be doped in situ. In other applications, the detector structure 115 may be initially formed as substantially un-doped epi material and thereafter doped with the appropriate dopant atoms by performing one or more ion implantation processes. In the case where the detector structure 115 is a P+ doped detector structure 115, the maximum concentration of dopant atoms in the P+ doped detector structure 115 may vary depending upon the particular application, e.g., 1E18-1E20 ions/cm$^3$. The location of the peak concentration of dopant atoms within the vertical thickness of the P+ doped detector structure 115 may also vary depending upon the particular application. The P+ doped detector structure 115 may be doped with any species of P-type dopant, e.g., boron, boron difluoride, etc. Additionally, in some embodiments, only a portion of the vertical thickness of the P+ doped detector structure 115, may be doped with the P-type dopant. For example, below a depth (or thickness) of about 150-220 nm, the P+ doped detector structure 115 may be a substantially un-doped region (i.e., an intrinsic region), while the remaining portion of the vertical thickness of the P+ doped detector structure 115 is doped with the appropriate P-type dopant.

In the depicted example in FIG. 11, the detector structure 115 is a unitary structure that comprises a body portion 115A (positioned above the upper surface 111S of the fins 111) and a plurality of downward-extending fin-type structures 115X that are positioned within the trenches 110 and interleaved with the upward extending fins 111 of the waveguide structure 104 (defined in the active semiconductor layer 101C), even though the downward-extending fin-type structures 115X are separated from the fins 111 by the sidewall spacers 113A. The vertical thickness of the body portion 115A may vary depending upon the particular application, e.g., 10-500 nm.

In the example shown in FIG. 11, the detector structure 115 was formed in such a manner that the epi material merged together so as to form the body 115A above the upper surface 111S of the fins 111. However, with reference to FIG. 12, in other applications, the detector structure 115 may be formed in such a manner that the epitaxial semiconductor material positioned above the upper surface 111S of the fins 111 does not merge above the upper surface 111S of the fins 111, e.g., the detector structure 115 may comprise a plurality of individual elements 115Y of epitaxial semiconductor material, wherein a first portion of each of the elements 115Y is positioned in the trenches 110 laterally between adjacent fins 111 while a second portion of each of the individual elements 115Y is positioned above a level that corresponds to the upper surface 111S of the fins 111. For ease of presentation, the remaining depictions of the photodetector structure 100 will be based upon the illustrative embodiment where the epi material of the detector structure 115 has a unitary structure comprising a body portion 115A and a plurality of downward-extending fins 115X.

Figure 13:
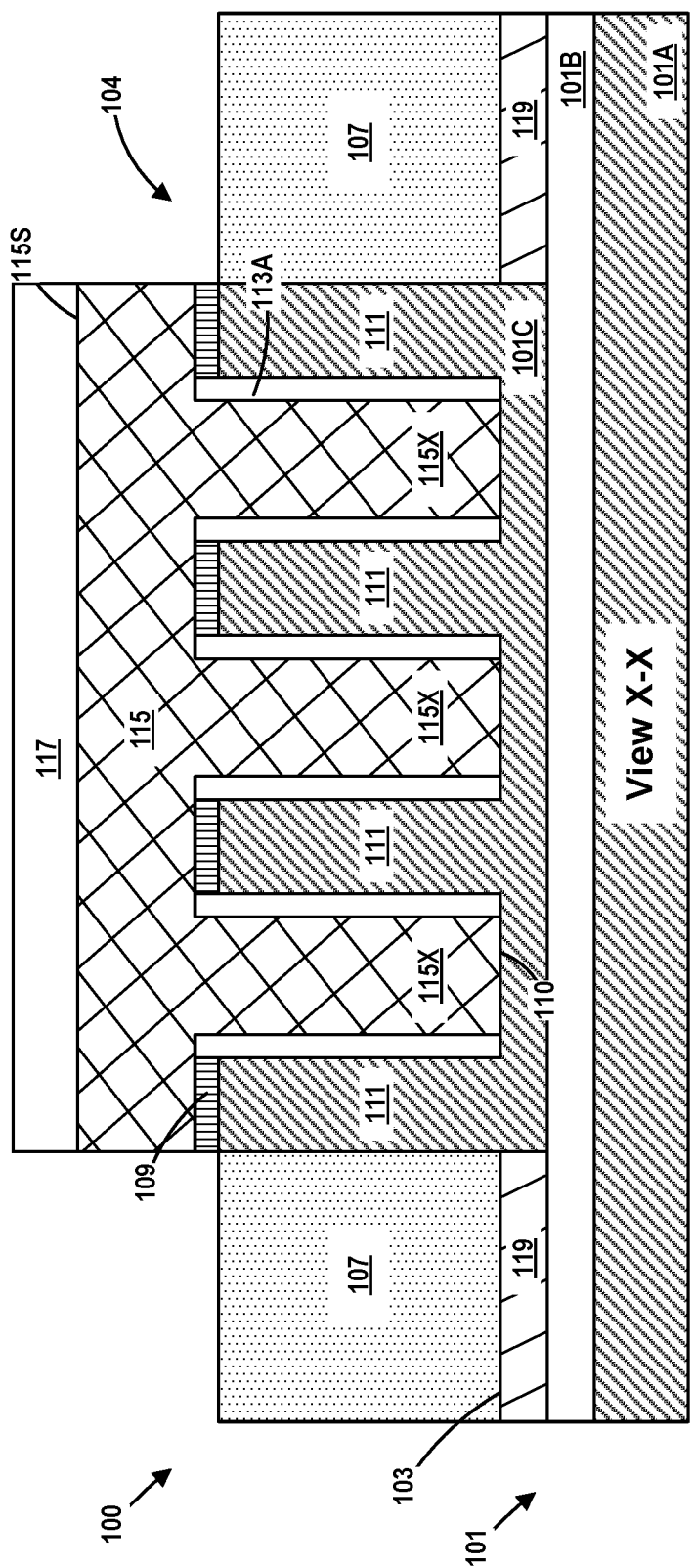

FIG. 13 depicts the photodetector structure 100 shown in FIG. 11 after several process operations were performed. First, a patterned implant mask 117 was formed above the detector structure 115. The patterned implant mask 117 may be comprised of a variety of different materials, e.g., photoresist, OPL, and it may be formed by performing traditional manufacturing techniques. Thereafter, at least one ion implantation process may be performed to form N++ doped contact regions 119 in the active semiconductor layer 101C. The maximum concentration of dopant atoms in the N++ doped contact regions 119 may vary depending upon the particular application, e.g., 1E20-1E22 ions/cm$^3$. The vertical depth of the N++ doped contact regions 119 and the location of the peak concentration of dopant atoms in N++ doped contact regions 119 may also vary depending upon the particular application. The N++ doped contact regions 119 may be doped with any species of N-type dopant, e.g., arsenic, phosphorus, etc.

Figure 14:
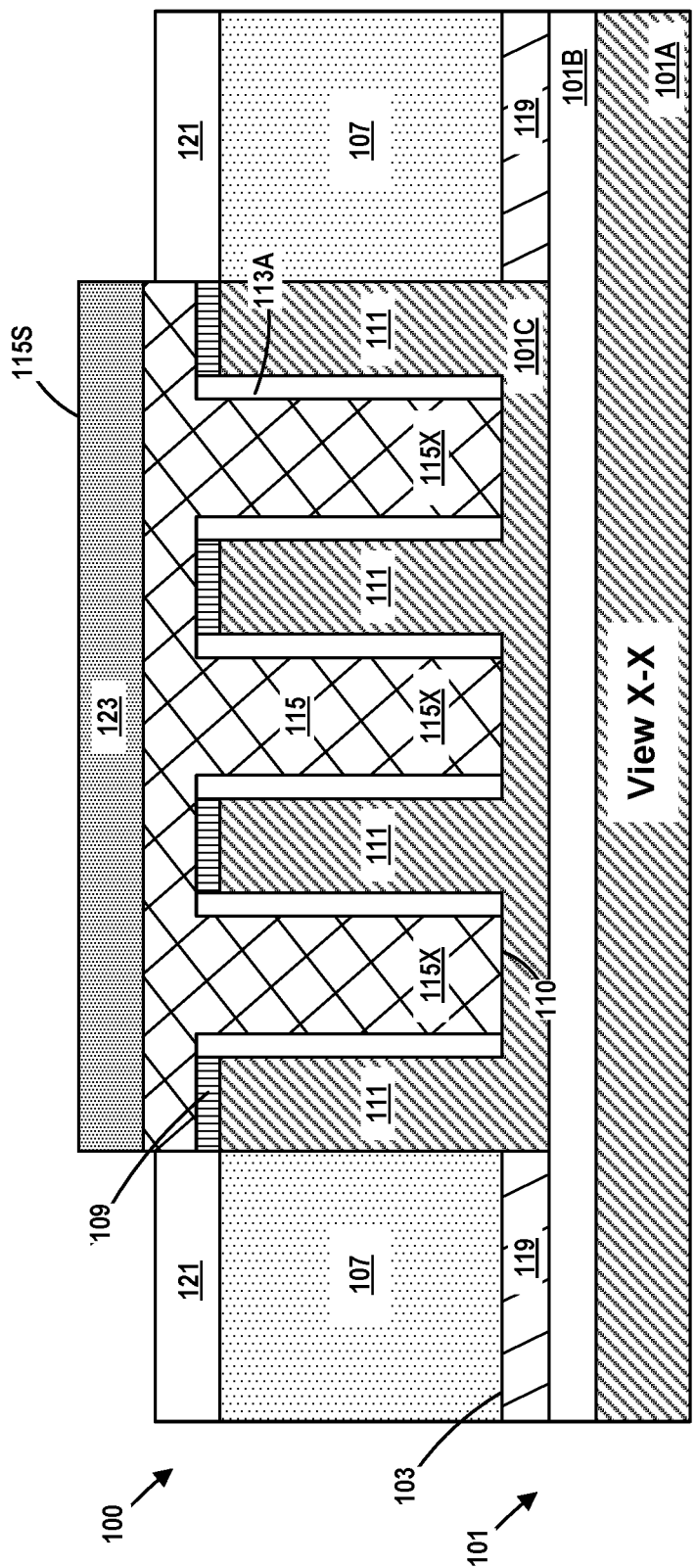

FIG. 14 depicts the photodetector structure 100 after several process operations were performed. First, the patterned implant mask 117 was removed. Thereafter, another patterned implant mask 121 was formed above the substrate. The patterned implant mask 121 exposes the upper surface 115S of the detector structure 115. The patterned implant mask 121 may be comprised of a variety of different materials, e.g., photoresist, OPL, and it may be formed by performing traditional manufacturing techniques. Thereafter, at least one ion implantation process may be performed to form a P++ doped contact region 123 in the P+ doped detector structure 115. The maximum concentration of dopant atoms in the P++ doped contact region 121 may vary depending upon the particular application, e.g., 1E20-1E22 ions/cm$^3$. The vertical depth of the P++ doped contact region 123 and the location of the peak concentration of dopant atoms in the P++ doped contact region 123 within the vertical thickness of the P+ doped detector structure 115 may also vary depending upon the particular application. The P++ doped contact region 123 may be doped with any species of P-type dopant, e.g., boron, boron difluoride, etc. The N++ doped contact regions 119 and the P++ doped contact region 123 may be formed in any desired sequence or order.

Figure 15:
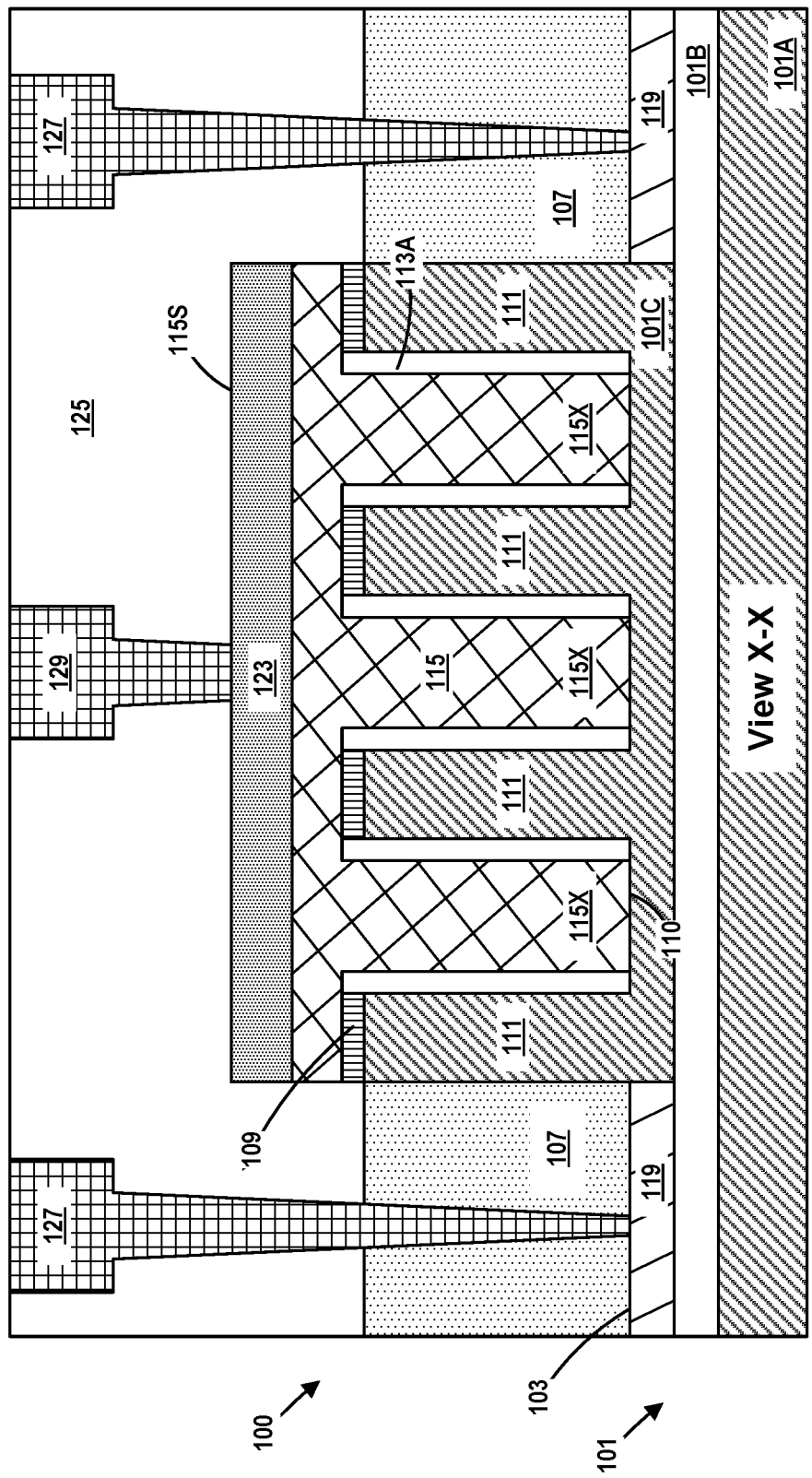

FIG. 15 depicts the photodetector structure 100 after several process operations were performed. First, the patterned implant mask 121 was removed. Thereafter, simplistically depicted one or more layers of insulating material 125 was formed above the photodetector structure 100. In a real-world device, the one or more layers of insulating material 125 may comprise multiple layers of material and the layers of material may be made of different materials. For example, the one or more layers of insulating material 125 may comprise one of more layers of silicon dioxide with a layer of silicon nitride (which functions as an etch stop layer) positioned between the layers of silicon dioxide. The structure, composition and techniques used to form such layer(s) of insulating material are well known to those skilled in the art. Thereafter, illustrative conductive contact structures 127 were formed to conductively contact the N++ doped contact regions 119 and an illustrative contact structure 129 was formed so as to conductively contact the P++ doped contact region 123. The structure, composition and techniques used to form such conductive contact structures 127, 129 are well known to those skilled in the art.

As will be appreciated by those skilled in the art after a complete reading of the present application, the novel photodetector 100 may be fabricated with a lower defect density as compared to at least some other photodetectors and may be more efficient while working in the sub-wavelength regime.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Note that the use of terms, such as "first," "second," "third" or "fourth" to describe various processes or structures in this specification and in the attached claims is only used as a shorthand reference to such steps/structures and does not necessarily imply that such steps/structures are performed/formed in that ordered sequence. Of course, depending upon the exact claim language, an ordered sequence of such processes may or may not be required. Accordingly, the protection sought herein is as set forth in the claims below.

The invention claimed is:

1. A photodetector, comprising:
    an N-doped waveguide structure defined in a semiconductor material, the N-doped waveguide structure comprising a plurality of first fins;
    a detector structure positioned on the N-doped waveguide structure, wherein a portion of the detector structure is positioned laterally between the plurality of first fins;
    at least one N-doped contact region positioned in the semiconductor material; and
    a P-doped contact region positioned in the detector structure.

2. The photodetector of claim 1, wherein the semiconductor material is an active semiconductor layer of a semiconductor-on-insulator (SOI) structure.

3. The photodetector of claim 1, wherein the N-doped waveguide structure has a dopant concentration of an N-type dopant that falls within a range of 1E18-1E20 ions/cm$^3$ and the detector structure is doped with a P-type dopant and has a dopant concentration of a P-type dopant that falls within a range of 1E18-1E20 ions/cm$^3$.

4. The photodetector of claim 1, wherein at least a portion of a vertical thickness of the detector structure is substantially free of a dopant material.

5. The photodetector of claim 1, further comprising a sidewall spacer positioned on each of the plurality of first fins, wherein the portion of the detector structure is laterally separated from the plurality of first fins by at least the sidewall spacer positioned on each of the plurality of first fins.

6. The photodetector of claim 1, wherein the detector structure is a unitary structure comprising a body and a plurality of second fins extending from the body, wherein the second fins are interleaved with the first fins.

7. The photodetector of claim 1, wherein the detector structure comprises a plurality of individual elements, wherein at least one of the plurality of individual elements is positioned laterally between the plurality of first fins.

8. The photodetector of claim 1, wherein the detector structure comprises one of a germanium-containing material, substantially pure germanium or silicon-germanium and wherein the N-doped waveguide structure comprises one of a silicon-containing material, substantially pure silicon or silicon germanium.

9. A photodetector, comprising:
    an N-doped waveguide structure defined in an active semiconductor layer of a semiconductor-on-insulator (SOI) structure, the N-doped waveguide structure comprising a plurality of first fins;
    a P-doped detector structure positioned on the N-doped waveguide structure, wherein a portion of the detector structure is positioned laterally between the plurality of first fins;
    a sidewall spacer positioned on each of the plurality of first fins, wherein the portion of the detector structure is laterally separated from the plurality of first fins by at least the sidewall spacer positioned on each of the plurality of first fins;
    at least one N-doped contact region positioned in the semiconductor material; and
    a P-doped contact region positioned in the detector structure.

10. The photodetector of claim 9, wherein the N-doped waveguide structure has a dopant concentration of an N-type dopant that falls within a range of 1E18-1E20 ions/cm$^3$ and the detector structure is doped with a P-type dopant and has a dopant concentration of a P-type dopant that falls within a range of 1E18-1E20 ions/cm$^3$.

11. The photodetector of claim 9, wherein at least a portion of a vertical thickness of the detector structure is substantially free of a dopant material.

12. The photodetector of claim 9, wherein the detector structure is a unitary structure comprising a body and a plurality of second fins extending from the body, wherein the second fins are interleaved with the first fins.

13. The photodetector of claim 9, wherein the detector structure comprises a plurality of individual elements, wherein at least one of the plurality of individual elements is positioned laterally between the plurality of first fins.

* * * * *